(12) United States Patent
Willis

(10) Patent No.: US 6,768,443 B2
(45) Date of Patent: Jul. 27, 2004

(54) SWITCH CAPACITOR CIRCUIT AND APPLICATIONS THEREOF

(76) Inventor: John Willis, 6530 Clairmont Dr., Austin, TX (US) 78749

( * ) Notice: Subject to any disclaimer, the term of this patent is extended or adjusted under 35 U.S.C. 154(b) by 0 days.

(21) Appl. No.: 09/728,027

(22) Filed: Nov. 30, 2000

(65) Prior Publication Data

US 2002/0063650 A1 May 30, 2002

(51) Int. Cl.[7] ............................................. H03M 1/12
(52) U.S. Cl. ................................... 341/172; 341/161
(58) Field of Search ................................. 341/172, 155, 341/161, 143, 144, 150; 327/554; 328/167

(56) References Cited

U.S. PATENT DOCUMENTS

| | | | |
|---|---|---|---|
| 4,851,841 A | | 7/1989 | Sooch |
| 5,140,325 A | | 8/1992 | Yu et al. |
| 5,177,484 A | | 1/1993 | Bruckmann |
| 5,572,212 A | | 11/1996 | Levinson et al. |
| 5,757,299 A | | 5/1998 | Noro et al. |
| 6,018,262 A | | 1/2000 | Noro et al. |
| 6,031,480 A | * | 2/2000 | Soenen et al. ............... 341/161 |
| 6,147,551 A | * | 11/2000 | Hong .......................... 327/554 |
| 6,278,785 B1 | * | 8/2001 | Thomasson .................. 381/66 |

* cited by examiner

*Primary Examiner*—Brian Young
*Assistant Examiner*—Joseph Lauture
(74) *Attorney, Agent, or Firm*—Timothy W. Markison

(57) ABSTRACT

An improved switch capacitor circuit includes a capacitor, a 1st voltage reference module, a $2^{nd}$ voltage reference module, and a plurality of switching elements. The capacitor is operably coupled via the plurality of switching elements to sample an input signal during a $1^{st}$ interval of a sampling period and during a $2^{nd}$ interval of the sampling period to provide a representation of the input signal. The $2^{nd}$ reference module produces a $2^{nd}$ reference voltage that is representative of the common mode of the supply (e.g. $V_{DD}$ and $V_{SS}$). The $1^{st}$ voltage reference module produces a $1^{st}$ reference voltage that is representative of the common mode of the analog input signal. As such, the capacitor is charged during the $1^{st}$ interval based on the $1^{st}$ reference voltage and discharged during the $2^{nd}$ interval based on the $2^{nd}$ reference voltage.

14 Claims, 4 Drawing Sheets

SWITCH CAPACITOR CIRCUIT AND APPLICATIONS THEREOF

TECHNICAL FIELD OF THE INVENTION

This invention relates generally to signal processing and in particular to signal processing utilizing switch capacitor circuits.

BACKGROUND OF THE INVENTION

As is known, switch capacitor circuits are used in a variety of applications. One such application is within an over sampling analog to digital converter. Such an over sampling analog to digital converter includes an over sampling front-end quantizer and a digital decimation filter. The over sampling front end quantizer may be a Sigma Delta modulator that includes switch capacitor circuits. The switch capacitor circuits are utilized to sample an input voltage with respect to reference voltages and to provide the sample to an operational amplifier and comparator. Based on this sampling, the front-end quantizer produces a high-speed single bit digital output stream, via the operational amplifier and the comparator. The digital decimation filter receives the high speed single-bit digital data stream and converts it into digital words.

In most over sampling analog to digital converter applications, the analog input is AC coupled to the analog to digital converter. As such, the DC components of the input signal are rejected thereby avoiding common mode issues. As a result, the reference voltages utilized within the switch capacitor circuit are the same. However, such an implementation does not provide the optimum common mode solution needed in certain applications where the analog input is DC coupled to the analog to digital converter.

Therefore, a need exists for an improved switch capacitor circuit that compensates for common mode issues such that the improved switch capacitor circuit may be utilized in a variety of applications, including analog to digital converters.

DETAILED DESCRIPTION OF A PREFERRED EMBODIMENT

Generally, the present invention provides an improved switch capacitor circuit for use in a wide variety of applications. The improved switch capacitor circuit includes a capacitor, a 1st voltage reference module, a $2^{nd}$ voltage reference module, and a plurality of switching elements. The capacitor is operably coupled via the plurality of switching elements to sample an input signal during a $1^{st}$ interval of a sampling period and during a $2^{nd}$ interval of the sampling period to provide a representation of the input signal. The $2^{nd}$ reference module produces a $2^{nd}$ reference voltage that is representative of the common mode of the supply (e.g. $V_{DD}$ and $V_{SS}$). The $1^{st}$ voltage reference module produces a $1^{st}$ reference voltage that is representative of the common mode of the analog input signal. As such, the capacitor is charged during the $1^{st}$ interval based on the $1^{st}$ reference voltage and discharged during the $2^{nd}$ interval based on the $2^{nd}$ reference voltage. With such an improved switch capacitor circuit, common mode issues associated with DC coupling an analog input to an analog to digital converter are substantially reduced, thereby allowing for improved analog to digital conversion in a wide variety of applications.

Figure 1:
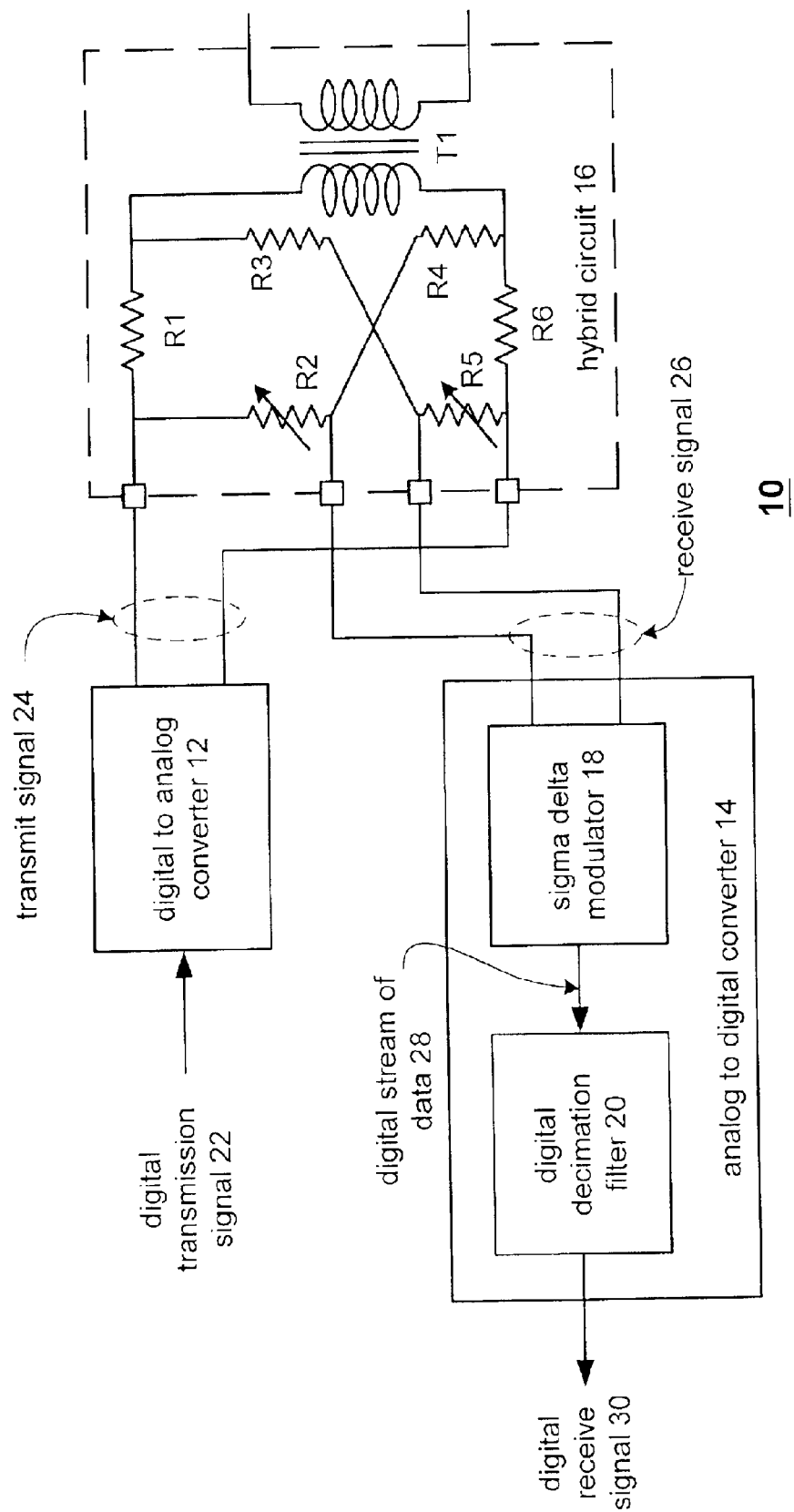
FIG. 1 illustrates a schematic block diagram of an analog front end for use in a telecommunication system in accordance with the present invention.

The present invention can be more fully described with reference to FIGS. 1 through 4. FIG. 1 illustrates a schematic block diagram of a telecommunication analog front end 10. The analog front end (AFE) 10 includes a digital to analog converter 12, an analog to digital converter 14, and a hybrid circuit 16. The digital to analog converter 12 receives digital transmission signals 22 from a telecommunication processing device (e.g., a SHDSL modem, HDSL modem, ADSL modem, UADSL modem, 56 k modem, et cetera). The digital to analog converter 12 converts the digital transmission signals 22 into analog transmit signals 24, which are provided to the hybrid circuit 16.

The hybrid circuit 16 includes a transformer T1 and a plurality of resistors R1 through R6. As coupled, the resistors R1 through R6 provide the coupling of transmission data and receive data. The transmit data is represented by the transmit signals 24 and the receive data is represented by receive signals 26. With this embodiment of the hybrid circuit 16, resistors R2 and R5 are adjustable to provide a balanced impedance matching of the line driven by the secondary winding of the transformer T1. As the resistors R2 and/or R5 are adjusted to provide impedance matching, the common mode of the receive and transmit signals 24 and 26 vary.

The analog to digital converter 14 is operably coupled to receive the receive signals 26. The analog to digital converter 14 includes a Sigma Delta modulator 18 and a digital decimation filter 20. A Sigma Delta modulator 18, which includes the improved switch capacitor circuit, which will be described with reference to FIGS. 2 through 4, receives the receive signal 26 and produces a digital stream of data 28. The digital decimation filter 20 produces a digital receive signal 30 from the digital stream of data 28. In the illustration shown, the analog to digital converter 14 may be implemented utilizing CMOS technology, which typically requires a power source of 2.5 volts to 3.3 volts. The hybrid circuit 16, however, is typically powered at approximately 5 volts. As such, to provide the selectable impedance matching, resistors R1–R6 of the hybrid circuit 16 are needed, but they DC couple the receive signal 26 to the analog to digital converter 14. Thus, the common mode of the receive signal 26 is different than the common mode of the power source for the analog to digital converter 14, which creates a common mode issue for the analog to digital converter. The issue being that the sigma delta modulator output may have a substantial DC offset and/or common mode error. By utilizing the improved switch capacitor circuit as described herein, the common mode issue is substantially resolved.

Figure 2:
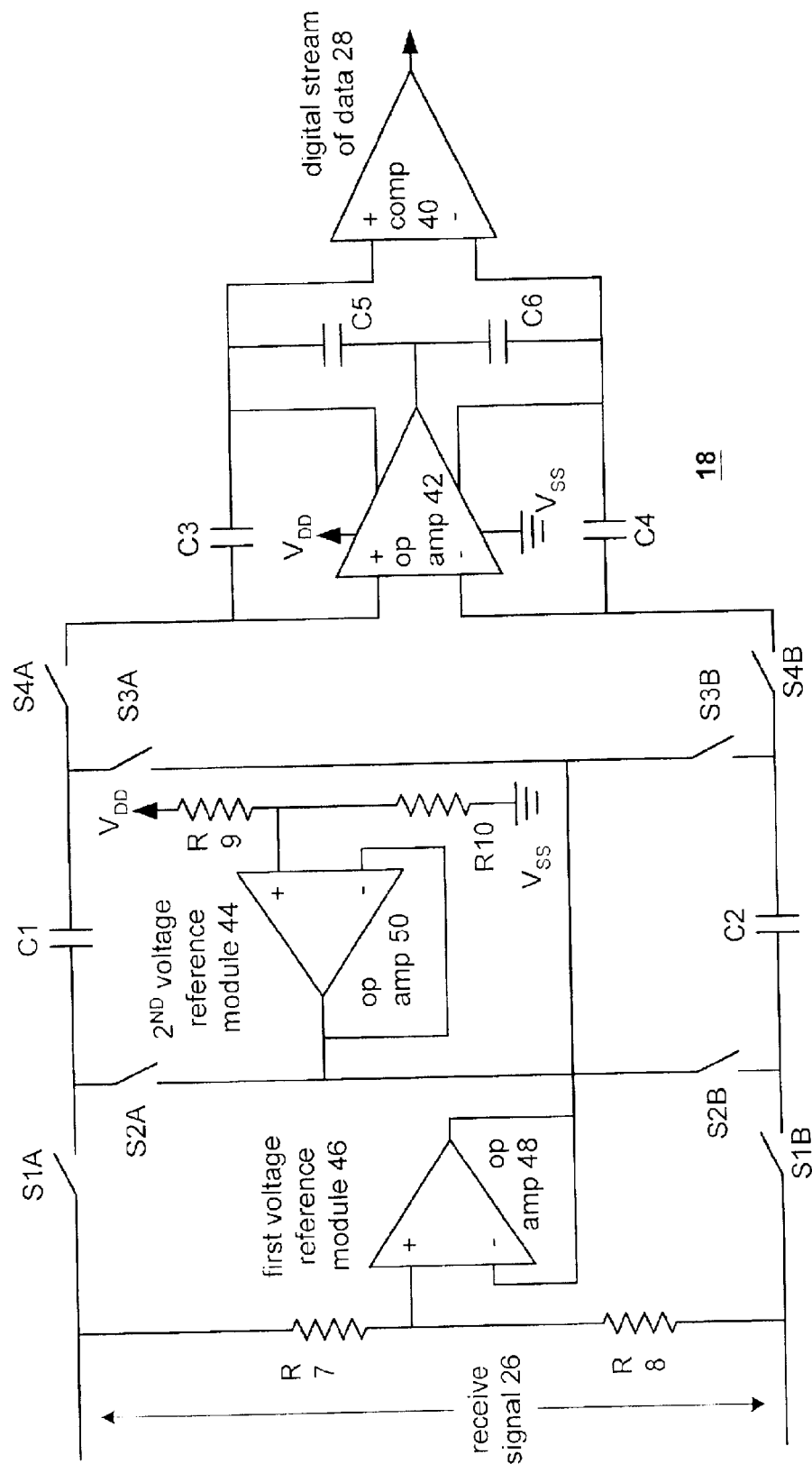
FIG. 2 illustrates a schematic block diagram of an over sampling front end quantizer that includes the improved switch capacitor circuit in accordance with the present invention.

FIG. 2 illustrates a schematic block diagram of the Sigma Delta modulator 18, which includes the improved switch capacitor circuits. The Sigma Delta modulator includes a plurality of operational amplifiers 42, 48 and 50, a comparator 40, a plurality of resistors R7 through R10, a plurality of capacitors C1 through C6 and a plurality of switching elements S1A through S4A and S1B through S4B. The 1$^{st}$ voltage reference module 46 includes operational amplifier 48 and resistors R7 and R8. By having the impedances of R7 and R8 substantially matched, or having any desired impedance ratio, and coupling the operational amplifier 48 as a unity gain amplifier, the output of operational amplifier 48 represents the common mode voltage of the receive signal 26.

2$^{nd}$ voltage reference module 44 includes operational amplifier 50 and resistors R9 and R10. With resistors R9 and R10 having substantially equal impedances, or having any desired impedance ratio, the tap of this resistor divider provides a common mode representation of the supply, which is represented by the differential voltage between $V_{DD}$ and $V_{SS}$. By coupling the operational amplifier 50 in a unity gain manner, the output of the operational amplifier represents the 2$^{nd}$ reference voltage.

Capacitor C1, the 1$^{st}$ and 2$^{nd}$ reference modules 46 and 44, switching elements S1A through S4A, which may be implemented via CMOS transistors, MOS transistors, or any other type of transistors or switching devices, comprise an improved switch capacitor circuit. In this illustration, the Sigma Delta modulator 18 is shown as a differential circuit. As such, a 2$^{nd}$ improved switch capacitor circuit includes the capacitor C2, the 1$^{st}$ and 2$^{nd}$ voltage reference modules 46 and 44, and switching elements S1B through S4B.

In operation, during a 1$^{st}$ interval of the sampling period, S1A and S3A are closed such that a charge is built up across capacitor C1 based on the receive signal 26 and the 1$^{st}$ reference voltage. Similarly, S1B and S3B are closed such that a charge is built-up on capacitor C2 via the receive signal 26 and the 1$^{st}$ reference voltage. During a 2$^{nd}$ interval of the sampling period, S1A, S3A, S1B and S3B are opened, while S2A, S4A, S2B and S4B are closed. During this interval, capacitors C1 and C2 are discharged with respect to the 2$^{nd}$ reference voltage and capacitors C3 and C4, respectively.

The output of differential operational amplifier 42 is provided to the inputs of comparator 40. The output of comparator 40 produces a bit in the digital stream of data 28 for each sampling period. Note that capacitors C5 and C6 provide a common mode input to the differential operational amplifier 42. In this configuration, the common mode issues caused by DC coupling the receive signal 26 into the Sigma Delta modulator 18 is overcome by utilizing the 1$^{st}$ voltage reference module 46. To further offset the common mode issues with respect to the reference signal 26 having a different voltage range than the supply, the 2$^{nd}$ voltage reference module 44 is included.

Figure 3:
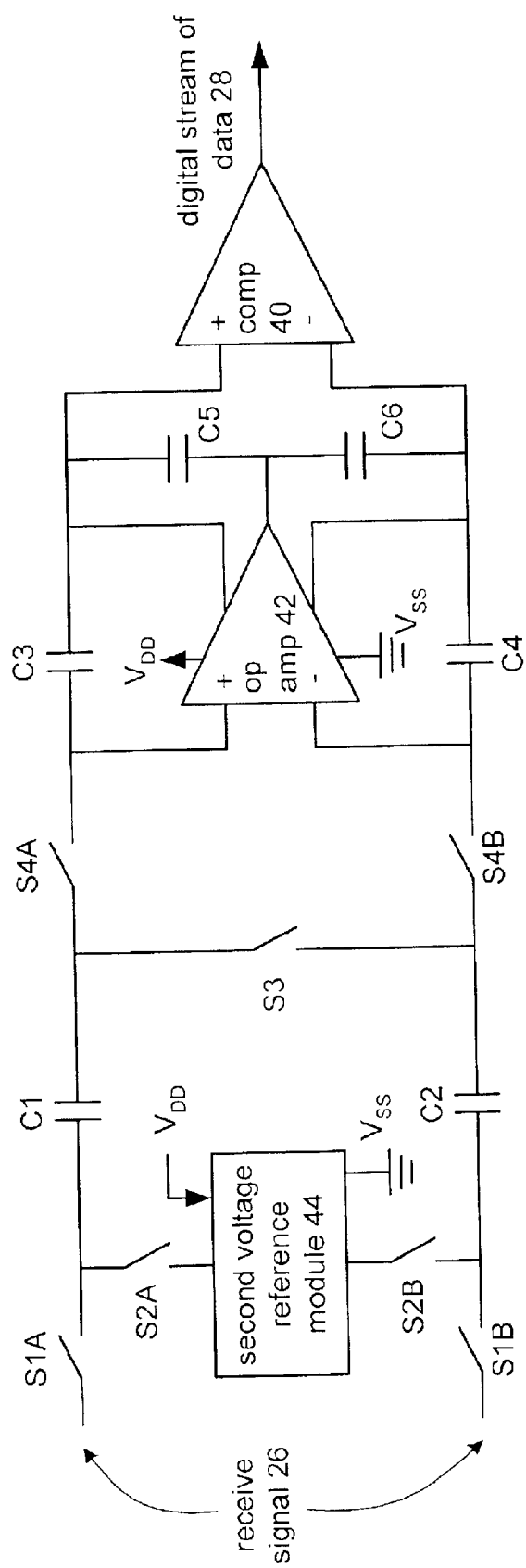
FIG. 3 illustrates a schematic block diagram of an alternate over sampling front end quantizer that includes the improved switch capacitor circuit in accordance with the present invention.

FIG. 3 illustrates a schematic block diagram of an alternate Sigma Delta modulator 18. In this embodiment, the Sigma Delta modulator 18 includes the comparator 40, the operational amplifier 42 and two improved switch capacitor circuits. The 1$^{st}$ switch capacitor circuit includes capacitor C1, switching elements S1A, S2A, S3 and S4A, and the 2$^{nd}$ voltage reference module 44. The 2$^{nd}$ improved switch capacitor circuit includes capacitor C2, switching elements S1B, S2B, S3 and S4B. In this embodiment, during the 1$^{st}$ interval of a sampling period, S1A, S3 and S1B are closed. During this interval, a charge representing the receive signal 26 is built-up across capacitor C1 and C2. During the 2$^{nd}$ interval of this sampling period, S1A, S1B and S3 are opened, while S2A, S4A, S2B and S4B are closed. In this manner, the charge across C1 and C2 is provided to capacitors C3 and C4 with reference to the voltage reference, which is produced by the 2$^{nd}$ voltage reference module 44. The operation of the operational amplifier 42 and comparator 40 is as described with reference to FIG. 2. As one of average skill in the art will appreciate, this embodiment still overcomes the issues associated with DC coupling an analog input to the analog to digital converter.

Figure 4:
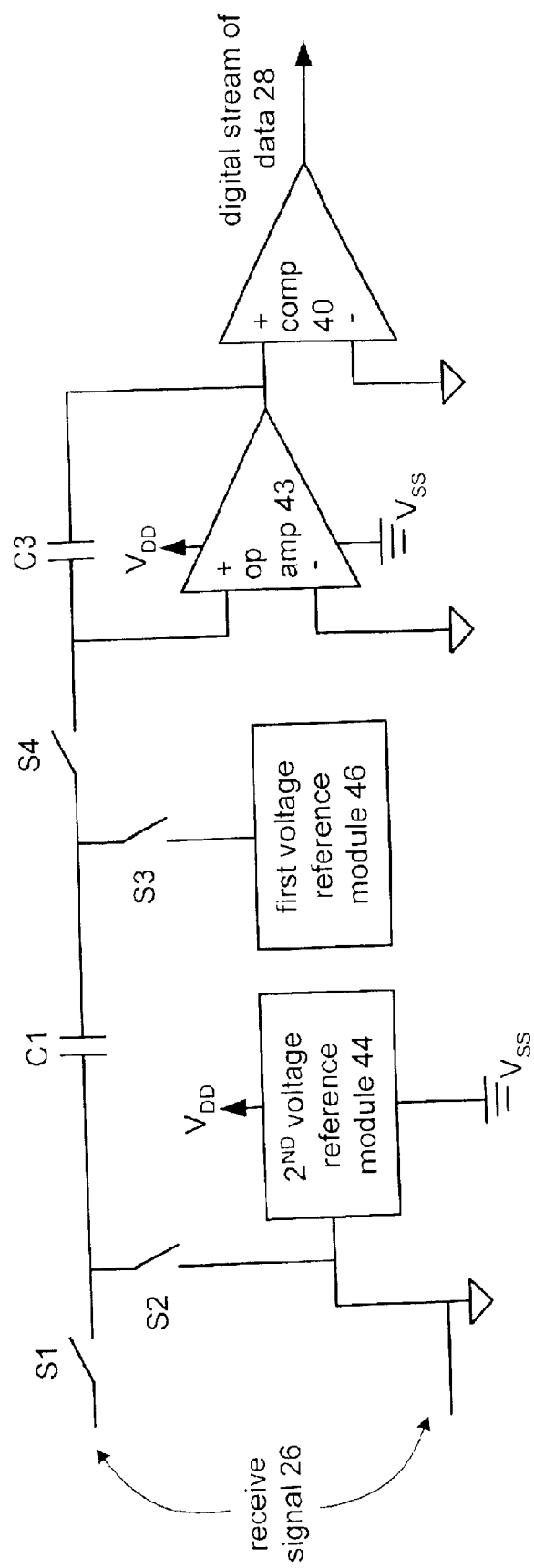
FIG. 4 illustrates a schematic block diagram of another over sampling front-end quantizer that includes the improved switch capacitor circuit in accordance with the present invention.

FIG. 4 illustrates a schematic block diagram of a single ended Sigma Delta modulator. The single ended Sigma Delta modulator 18 includes the 1$^{st}$ voltage reference module 46, the 2$^{nd}$ voltage reference module 44, the operational amplifier 43, and comparator 40. In this embodiment, only a single improved switch capacitor circuit is used. The switch capacitor circuit includes capacitor C1, switching elements S1 through S4, the 1$^{st}$ voltage reference module 46 and the 2$^{nd}$ voltage reference module 44. In this embodiment, the 2$^{nd}$ voltage reference module 44 provides a reference voltage that is coupled to the inverting input of the operational amplifier 43, one leg of the received signal 26, and an input of the comparator 40. The non-inverting input of operational amplifier 43 is operably coupled to receive the signal provided by the switch capacitor circuit. In operation, during a 1$^{st}$ interval of a sampling period, S1 and S3 are closed. As such, a charge is built-up across capacitor C1 based on the receive signal 26 and the 1$^{st}$ reference voltage. During a 2$^{nd}$ interval of the sampling period, the charge built across C1 is transferred to capacitor C3 based on the 2$^{nd}$ reference voltage. As such, the DC component of the receive signal 26 is compensated for as well as the differences in voltages between the received signal and the power source.

The preceding discussion has presented an improved switch capacitor circuit and applications thereof. As one of average skill in the art will appreciate, other embodiments may be derived from the teaching of the present invention without deviating from the scope of the claims.

What is claimed is:

1. A switched capacitor circuit comprises:
    capacitor having a first plate and a second plate:
    first voltage reference module operably coupled to provide a first reference voltage;
    second voltage reference module operably coupled to provide a second reference voltage;
    first switching element operable to couple an input signal to the first plate during a first interval;
    second switching element operable to couple the first plate to the second reference voltage during a second interval;
    third switching element, operable to couple the second plate to the first reference voltage to build a representative charge of the input signal across the capacitor during the first interval; and
    fourth switching element operable to provide a change transfer from the second plate during the second interval.

2. The switched capacitor circuit of claim 1 further comprises:
    operational amplifier that includes a first input, a second input, and an output, wherein the first input is operably coupled to the fourth switching element, the second input is operably coupled to the second reference voltage, and the output provides a representation of the input signal; and a feedback capacitor operably coupled to the first input and the output of the operational amplifier.

3. The switched capacitor circuit of claim 1 further comprises:
  second capacitor having a first plate and a second plate:
  fifth switching element operable to couple the input signal to the first plate of the second capacitor during the first interval;
  sixth switching element operable to couple the first plate of the second capacitor to the second reference voltage during a second interval;
  seventh switching element operable to couple the second plate of the second capacitor to the first reference voltage to build a representative charge of the input signal across the second capacitor; and
  eighth switching element operable to provide a charge transfer from the second plate of the second capacitor during the second interval;
  operational amplifier that includes a first input, a second input, and a differential output, wherein the first input is operably coupled to the fourth switching element, the second input is operably coupled to the eighth switching element, and the differential output provides a representation of the input signal;
  first feedback capacitor operably couple to the first input and the differential output of the operational amplifier; and
  second feedback capacitor operably coupled to the second input and the differential output of the operational amplifier.

4. The switched capacitor circuit of claim 1, wherein the first voltage reference module further comprises:
  a voltage divider operably coupled to the input signal, wherein a tap of the divider provides a common mode voltage of the input; and
  operational amplifier having a first input, a second input, and an output, wherein the first input is operably coupled to the tap of the divider, and the second input is coupled to the output, wherein the output provide the first reference voltage.

5. The switched capacitor circuit of claim 1, wherein the second voltage reference module further comprises:
  a voltage divider operably coupled to a power supply, wherein a tap of the divider provides a common mode voltage of the power supply; and
  operational amplifier having a first input, a second input, and an output, wherein the first input is operably coupled to the tap of the divider, and the second input is coupled to the output, wherein the output provide the second reference voltage.

6. An analog to digital converter comprises:
  sigma delta modulator operably coupled to receive an input signal and produce therefrom a digital stream of data, wherein the sigma delta modulator includes:
    capacitor having a first plate and a second plate:
    first voltage reference module operably coupled to provide a first reference voltage;
    second voltage reference module operably coupled to provide a second reference voltage;
    first switching element operable to couple the input signal to the first plate during a first interval;
    second switching element operable to couple the first plate to the second reference voltage during a second interval;
    third switching element operable to couple the second plate to the first reference voltage to build a representative charge of the input signal across the capacitor;
    fourth switching element operable to provide a charge transfer from the second plate during the second interval;
    operational amplifier that includes a first input, a second input, and an output, wherein at least the first input is operably coupled to receive the charge transfer, and wherein the output provides a representation of the input signal;
    a feedback capacitor operably coupled to the first input and the output of the operational amplifier; and
    comparator operably coupled to compare the representation of the input signal with a reference to produce the digital stream of data; and
  digital decimation filter operably coupled to receive the digital stream of data and produce therefrom a digital output.

7. The analog to digital converter of claim 6, wherein the sigma delta modulator further comprises:
  second capacitor having a first plate and a second plate:
  fifth switching element operable to couple the input signal to the first plate of the second capacitor during the first interval;
  sixth switching element operable to couple the first plate of the second capacitor to the second reference voltage during a second interval;
  seventh switching element operable to couple the second plate of the second capacitor to the first reference voltage to build a representative charge of the input signal across the second capacitor; and
  eighth switching element operable to provide a charge transfer from the second plate of the second capacitor during the second interval;
  second feedback capacitor operably coupled to the second input and the differential output of the operational amplifier, wherein the operational amplifier further includes a differential output, wherein the second input is operably coupled to the eighth switching element, and the differential output provides the representation of the input signal; and
  first feedback capacitor operably coupled to the second input and a differential output of the operational amplifier.

8. The analog to digital converter of claim 6, wherein the first voltage reference module further comprises:
  a voltage divider operably coupled to the input signal, wherein a tap of the divider provides a common mode voltage of the input signal; and
  second operational amplifier having a first input, a second input, and an output, wherein the first input is operably coupled to the tap of the divider, and he second input is coupled to the output, wherein the output provide the first reference voltage.

9. The analog to digital converter of claim 6, wherein the second voltage reference module further comprises:
  a voltage divider operably coupled to a power supply, wherein a tap of the divider provides a common mode voltage of the power supply; and
  second operational amplifier having a first input, a second input, and an output, wherein the first input is operably coupled to the tap of the divider, and the second input is coupled to the output, wherein the output provide the second reference voltage.

10. A telecommunication analog front end comprises:
  hybrid circuit operably coupled to inter-couple a transmit signal and a receive signal to and from a twisted pair;

digital to analog converter operably coupled to produce the transmit signal from a digital transmission signal; and analog to digital converter that includes:

sigma delta modulator operably coupled to receive the receive signal and produce therefrom a digital stream of data, wherein the sigma delta modulator includes:

capacitor having a first plate and a second plate:

first voltage reference module operably coupled to provide a first reference voltage;

second voltage reference module operably coupled to provide a second reference voltage;

first switching element operable to couple the input signal to the first plate during a first interval;

second switching element operable to couple the first plate to the second reference voltage during a second interval;

third switching element operable to couple the second plate to the first reference voltage to build a representative charge of an receive signal across the capacitor;

fourth switching element operable to provide a charge transfer from the second plate during the second interval;

operational amplifier that includes a first input, a second input, and an output, wherein at least the first input is operably coupled to receive the charge transfer, and wherein the output provides a representation of the receive signal;

a feedback capacitor operably coupled to the first input and the output of the operational amplifier; and comparator operably coupled to compare the representation of the receive signal with a reference to produce the digital stream of data; and digital decimation filter operably coupled to receive the digital stream of data and produce therefrom a digital receive signal.

11. The telecommunication analog front end of claim 10, wherein the sigma delta modulator further comprises:

second capacitor having a first plate and a second plate:

fifth switching element operable to couple the received signal to the first plate of the second capacitor during the first interval;

sixth switching element operable to couple the first plate of the second capacitor to the second reference voltage during a second interval;

seventh switching element operable to couple the second plate of the second capacitor to the first reference voltage to build a representative charge of the input signal across the second capacitor;

eighth switching element operable to provide a charge transfer from the second plate of the second capacitor during the second interval;

second feedback capacitor operably coupled to the second input and the differential output of the operational amplifier, wherein the operational amplifier further includes a differential output, wherein the second input is operably coupled to the eighth switching element, and the differential output provides the representation of the input signal; and second feedback capacitor operably coupled to the second input and the differential output of the operational amplifier.

12. The telecommunication analog front end of claim 10, wherein the first voltage reference module further comprises:

a voltage divider operably coupled to the input signal, wherein a tap of the divider provides a common mode voltage of the input signal; and second operational amplifier having a first input, a second input, and an output, wherein the first input is operably coupled to the tap of the divider, and the second input is coupled to the output, wherein the output provide the first reference voltage.

13. The telecommunication analog front end of claim 10, wherein the second voltage reference module further comprises:

a voltage divider operably coupled to a power supply, wherein a tap of the divider provides a common mode voltage of the power supply; and second operational amplifier having a first input, a second input, and an output, wherein the first input is operably coupled to the tap of the divider, and the second input is coupled to the output, wherein the output provide the second reference voltage.

14. The telecommunication analog front end of claim 10, wherein the hybrid further comprises an adjustable impedance.

* * * * *